United States Patent [19]

Bergemont

[11] Patent Number: 5,615,152
[45] Date of Patent: Mar. 25, 1997

[54] METHOD OF ERASING A HIGH DENSITY CONTACTLESS FLASH EPROM ARRAY

[75] Inventor: Albert Bergemont, San Jose, Calif.

[73] Assignee: National Semiconductor Corporation, Santa Clara, Calif.

[21] Appl. No.: 648,423

[22] Filed: May 15, 1996

Related U.S. Application Data

[62] Division of Ser. No. 465,196, Jun. 5, 1995, which is a continuation of Ser. No. 361,848, Dec. 21, 1994, abandoned, which is a continuation of Ser. No. 988,293, Dec. 8, 1992, abandoned.

[51] Int. Cl.$^6$ ................................................. G11C 16/04
[52] U.S. Cl. .................. 365/185.18; 365/185.16; 365/185.19; 365/185.26; 365/185.27; 365/185.29
[58] Field of Search .................. 365/185.16, 185.18, 365/185.19, 185.26, 185.27, 185.29

[56] References Cited

U.S. PATENT DOCUMENTS

| | | | |
|---|---|---|---|
| 3,881,180 | 4/1975 | Gosney, Jr. | 357/23 |
| 5,060,195 | 10/1991 | Gill et al. | 365/185 |
| 5,128,895 | 7/1992 | Park | 365/185 |
| 5,132,933 | 7/1992 | Schreck et al. | 365/226 |
| 5,172,200 | 12/1992 | Muragishi et al. | 257/315 |
| 5,179,427 | 1/1993 | Nakayama et al. | 257/211 |
| 5,204,835 | 4/1993 | Eitan | 365/185 |
| 5,262,846 | 11/1993 | Gill et al. | 365/185 |
| 5,262,985 | 11/1993 | Wada | 365/185 |
| 5,268,318 | 12/1993 | Harari | 365/185 |
| 5,274,588 | 12/1993 | Manzur et al. | 365/185 |
| 5,293,331 | 3/1994 | Hart et al. | 365/185 |
| 5,293,337 | 3/1994 | Aritome et al. | 365/185 |
| 5,327,378 | 7/1994 | Kazerounian | 365/185 |
| 5,379,254 | 1/1995 | Chang | 365/185 |

FOREIGN PATENT DOCUMENTS

| | | |
|---|---|---|
| 0461764A2 | 12/1991 | European Pat. Off. . |
| 0555039A2 | 8/1993 | European Pat. Off. . |
| 2241380 | 8/1991 | United Kingdom . |
| 94/14196 | 6/1994 | WIPO . |

OTHER PUBLICATIONS

Toshikatsu Jinbo et al., "A 5–V–Only 16–Mb Flash Memory with Sector Erase Mode", IEEE Journal of Solid State Circuits, vol. 27, No. 11, Nov. 1992, New York, US, pp. 1547–1553.

Primary Examiner—Joseph E. Clawson, Jr.
Attorney, Agent, or Firm—Limbach & Limbach L.L.P.

[57] ABSTRACT

The present invention provides a contactless flash EPROM array formed in a P-well in a diffused silicon substrate of N-type conductivity. To facilitate a channel erase operation, thin tunnel oxide is formed between the P-well and the overlying polysilicon floating gate EPROM cells. The array is programmed in a conventional EPROM cell array manner. However, in accordance with the invention, the channel erase of a selected row of EPROM cells is accomplished by allowing all bit lines to float, applying a negative erase voltage to the word line of the selected row and holding the substrate at the supply voltage.

2 Claims, 15 Drawing Sheets

METHOD OF ERASING A HIGH DENSITY CONTACTLESS FLASH EPROM ARRAY

This is a divisional application under 37 CFR 1.60, of pending prior application Ser. No. 08/465,196 filed on Jun. 5, 1995 of ALBERT BERGEMONT for HIGH DENSITY CONTACTLESS FLASH EPROM ARRAY USING CHANNEL ERASE, which is a continuation of Ser. No. 08/361,848, filed Dec. 21, 1994, which is a continuation of Ser. No. 07/988,293, filed on Dec. 8, 1992.

BACKGROUND OF THE INVENTION

1. Field of the Invention

The present invention relates to electrically programmable read only memory (EPROM) devices and, in particular, to a contactless flash EPROM cell array that utilizes a low current channel erase mechanism.

2. Discussion of the Prior Art

FIG. 1 shows a portion of Intel's well-known ETOX EPROM array 10 wherein two ETOX cells 12a and 12b share one drain contact 14. FIG. 2 shows a cross-section of an individual ETOX cell 12 taken along line A—A (i.e. along polysilicon (poly 2) word line 16) in FIG. 1. FIG. 3 shows a cross-section of an ETOX cell 12 taken along line B—B (i.e. along buried N+ bit line 18) in FIG. 1.

The ETOX array 10 is based on the standard "T-shaped" ETOX cell. As shown in FIGS. 2 and 3, the ETOX cell 12 is implemented utilizing a very thin gate oxide 20 (about 100 Å) and graded N+/N− source regions 22 to prevent disturbances due to junction breakdown when the cell 12 is being erased.

As shown in FIG. 4A, the ETOX cell is written in the conventional EPROM manner. That is, hot electrons are injected from the graded source region 22 into the polysilicon (poly1) floating gate 24 when the poly 2 word line 16 and the N+ bit line (drain) 14 are both high.

As shown in FIG. 4B, erasing the ETOX cell 12 is performed by Fowler-Nordheim tunneling of electrons from the floating gate 24 through the thin oxide 20 to the graded source region 22 when the source region 22 is high, the drain 14 is floating and the word line 16 is low. As stated above, the source 22 is graded to prevent junction breakdown during the erase operation.

As discussed by Verma et al., "Reliability Performance of ETOX Based Flash Memories", the programming of flash EPROM cells, such as the above-described ETOX cell, may cause certain cell disturbances. Thus, an important consideration in the design of flash EPROM cells is the proper selection of read and programming voltages in order to minimize these disturbs.

Furthermore, the above-described ETOX array utilizes a cell architecture that requires one drain contact for every two cells in the array. The relatively large size of the contacts places a severe scaling limitation on the array.

U.S. patent application Ser. No. 539,657, filed by Boaz Eitan on Jun. 13, 1990, titled EPROM VIRTUAL GROUND ARRAY, discloses a so-called "contactless" alternate metal virtual ground (AMG) EPROM cell array and its associated process flow. Eitan's AMG concept is attractive because it allows high density EPROMs to be fabricated without using aggressive fabrication technologies and design rules.

As shown in FIGS. 5 and 6, the basic idea of the Eitan array 30 is the use of a "cross-point" EPROM cell that is defined by the crossing of perpendicular poly1 floating gate lines 32 and poly2 word lines 34 in a virtual ground array. To avoid drain turn-on, i.e. electron leakage from unselected cells on the same bit line as a selected cell, metal 36 contacts silicon every two N+ bit lines 38 to define the drain lines of the array and the non-contacted N+ bit lines 40 are connected to ground only via access transistors 42 driven by access select lines 44 to define the source lines of the array.

In the Eitan architecture, each drain bit line 38 is contacted only once every 64 cells, each block of 64 cells on the same drain bit line 38 constituting one "segment." Thus, when programming a particular cell in the array 30, only one 64-cell segment need be addressed; all other segments are "off." Therefore, the cells in the unselected segments are not susceptible to leakage.

U.S. patent application Ser. No. 830,938, filed by Albert Bergemont on Feb. 4, 1992, titled ALTERNATE METAL/SOURCE VIRTUAL GROUND FLASH CELL ARRAY, which is commonly-assigned herewith to National Semiconductor Corporation, discloses an AMG flash EPROM array concept.

As shown in FIGS. 7–9, the Bergemont array 50 differs from the Eitan array in two primary aspects. First, alternate N+ bit lines receive an additional phosphorous implant to provide graded N+/N− source bit lines 52 for the array cells. Furthermore, in a reversal of the Eitan concept, the N+/N− graded source bit lines 52, rather than the N+ drain bit lines 56, are contacted by metal 54 in segmented fashion; the intermediate node N+ drain bit lines 56 are noncontacted. As shown in FIG. 8, optionally, the N+ drain bit lines 56 of the Bergemont array can receive a boron implant to provide N+/P− drain lines 56. The Bergemont array retains the basic "cross-point" cell architecture in that the cells of the array are defined by the perpendicular crossing of poly1 floating gate lines 58 and poly2 word lines 60. Note that, as shown in FIG. 7, the Bergemont cell includes poly1 extensions over field oxide (Fox) in the array in order to achieve a correct coupling from the control gate (i.e. word line 60) to the floating gate 58, particularly in flash applications wherein the thickness of the floating gate oxide is approximately 100Å.

The Bergemont architecture facilitates a flash erase mode, wherein an erase voltage is applied to each of the N+/N− source bit lines 52 while both access select lines 62 are held at ground. This causes Fowler-Nordheim tunneling of electrons from the floating gate 58 to the source side 52 of the cell. The graded N+/N− source junction prevents junction breakdown.

The above-described Bergemont AMG flash EPROM array provides a significant advance over the conventional flash ETOX technology by achieving a contactless array. However, like the flash ETOX technology, the double-diffused source lines place a scaling constraint on the effective channel length of the cell.

SUMMARY

The present invention provides a contactless flash EPROM array formed in a silicon substrate of P-type conductivity. To facilitate the channel erase operation, thin tunnel oxide is formed between the substrate and the overlying polysilicon floating gate EPROM cells. The array is programmed in a conventional AMG EPROM cell array manner. However, in accordance with the invention, the channel erase of a selected row of EPROM cells is accomplished by allowing all bit lines to float, applying a negative erase voltage to the word line of the selected row and holding the substrate at the supply voltage.

A better understanding of the features and advantages of the present invention will be obtained by reference to the following detailed description and accompanying drawings which set forth an illustrative embodiment in which the principals of the invention are utilized.

DETAILED DESCRIPTION OF THE INVENTION

A process methodology will now be described for the fabrication of a contactless flash EPROM array in accordance with the concepts of the present invention.

Figure 1:
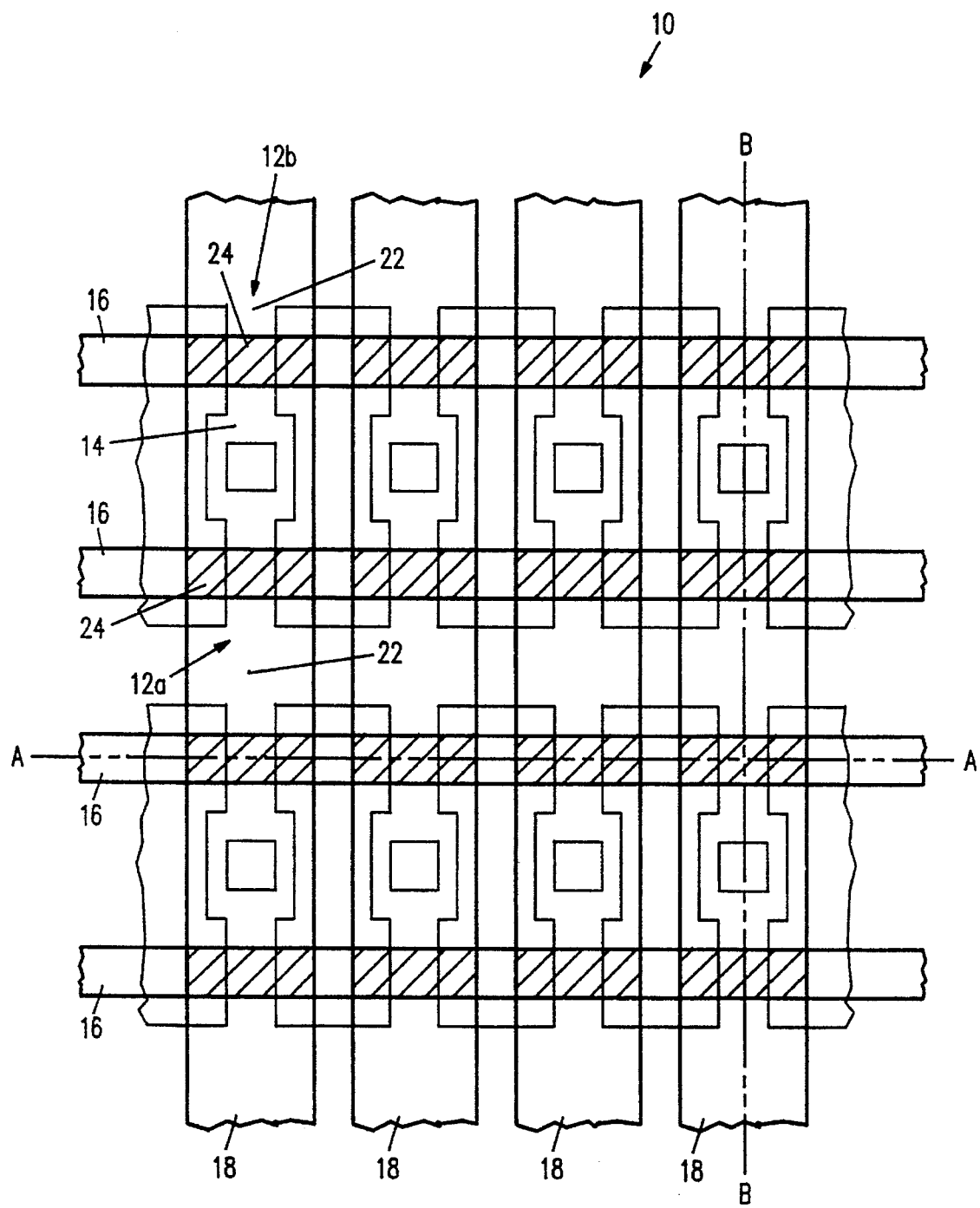
FIG. 1 is layout illustrating a portion off a conventional T-shaped ETOX EPROM cell array.
Figure 2:
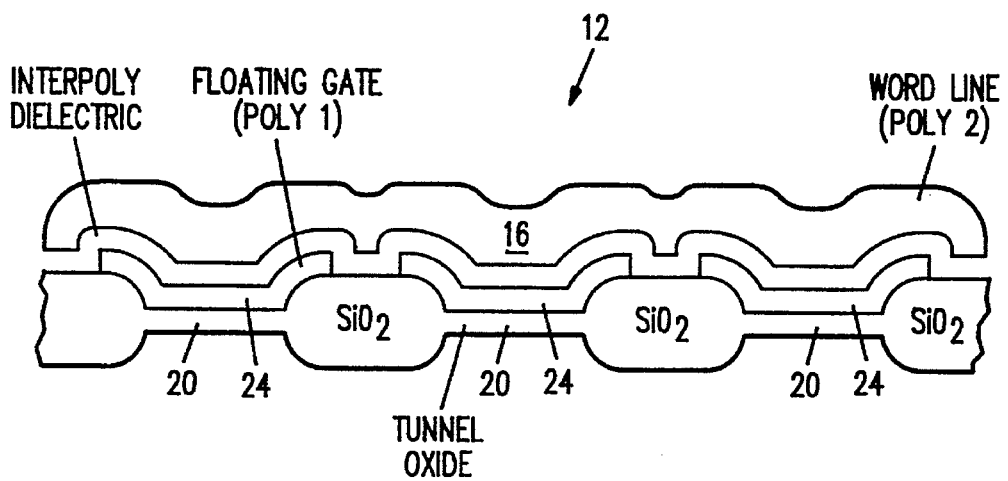
FIG. 2 is a cross-sectional view illustrating an individual ETOX cell taken along line A—A of FIG. 1.
Figure 3:
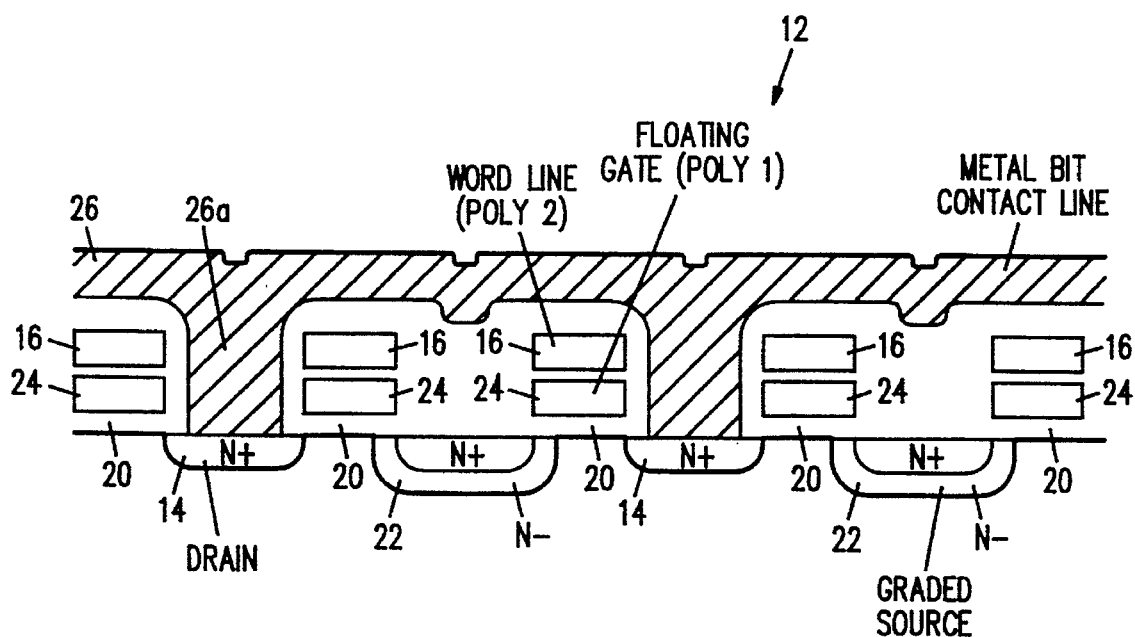
FIG. 3 is a cross-sectional view illustrating an individual ETOX cell taken along line B—B of FIG. 1.
Figure 4A:
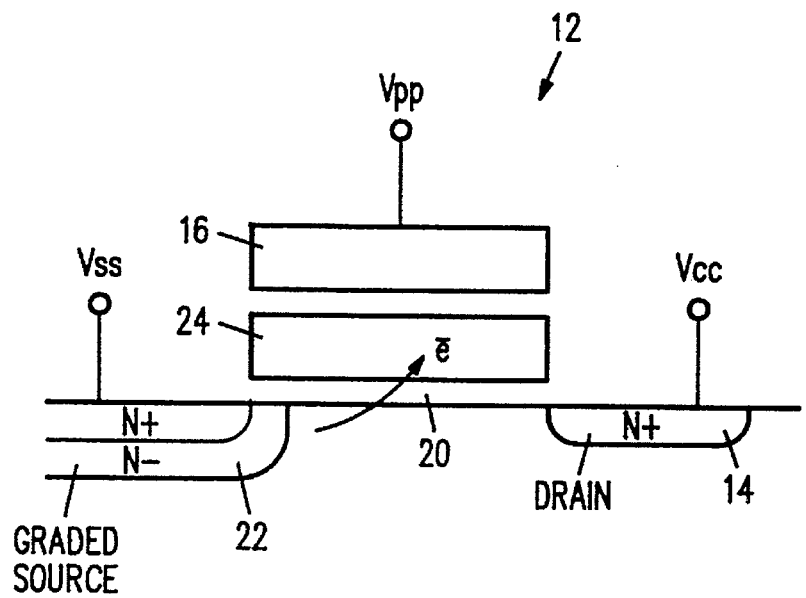
FIG. 4A is a cross-sectional view illustrating conventional ETOX cell programming by hot electron injection to the cell's floating gate.
Figure 4B:
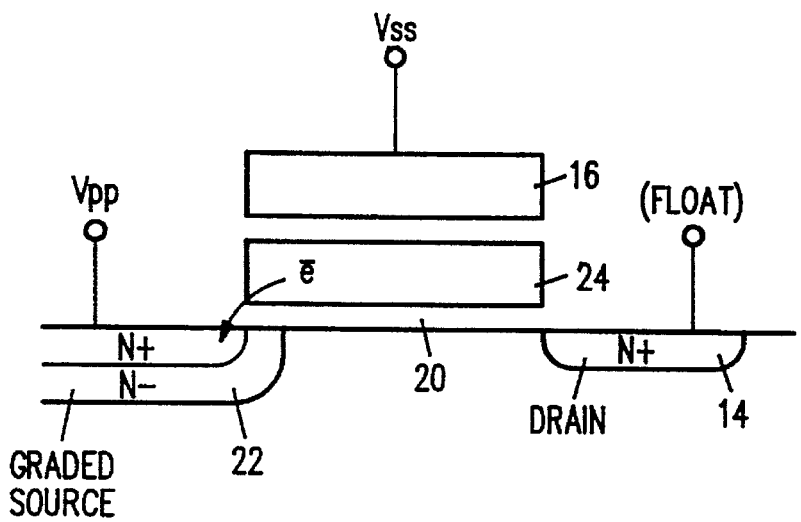
FIG. 4B is a cross-sectional view illustrating ETOX cell erasure by Fowler-Nordheim tunneling of electrons from the cell's floating gate.
Figure 5:
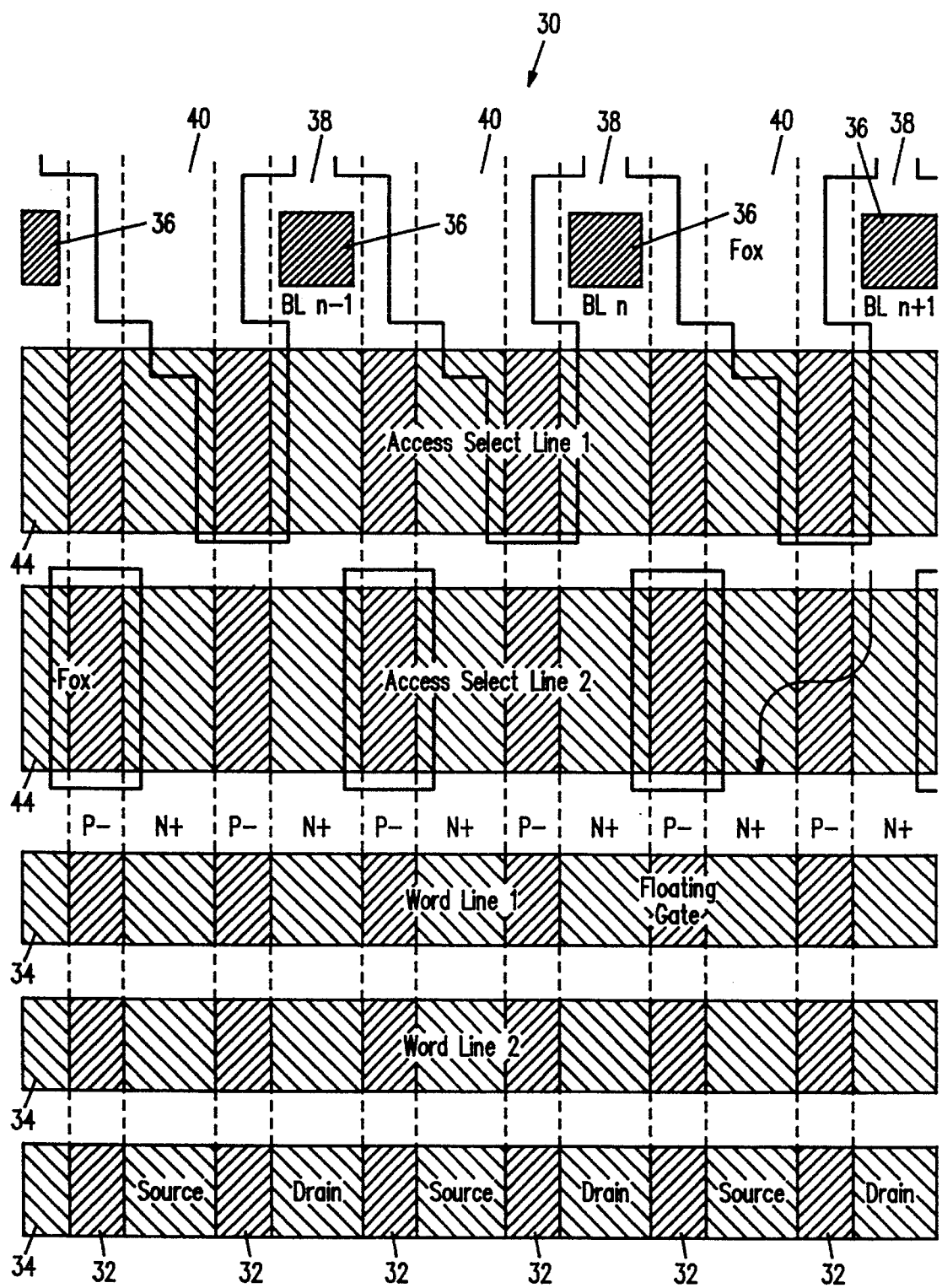
FIG. 5 is a layout drawing illustrating a portion of a conventional cross-point AMG EPROM cell array.
Figure 6:
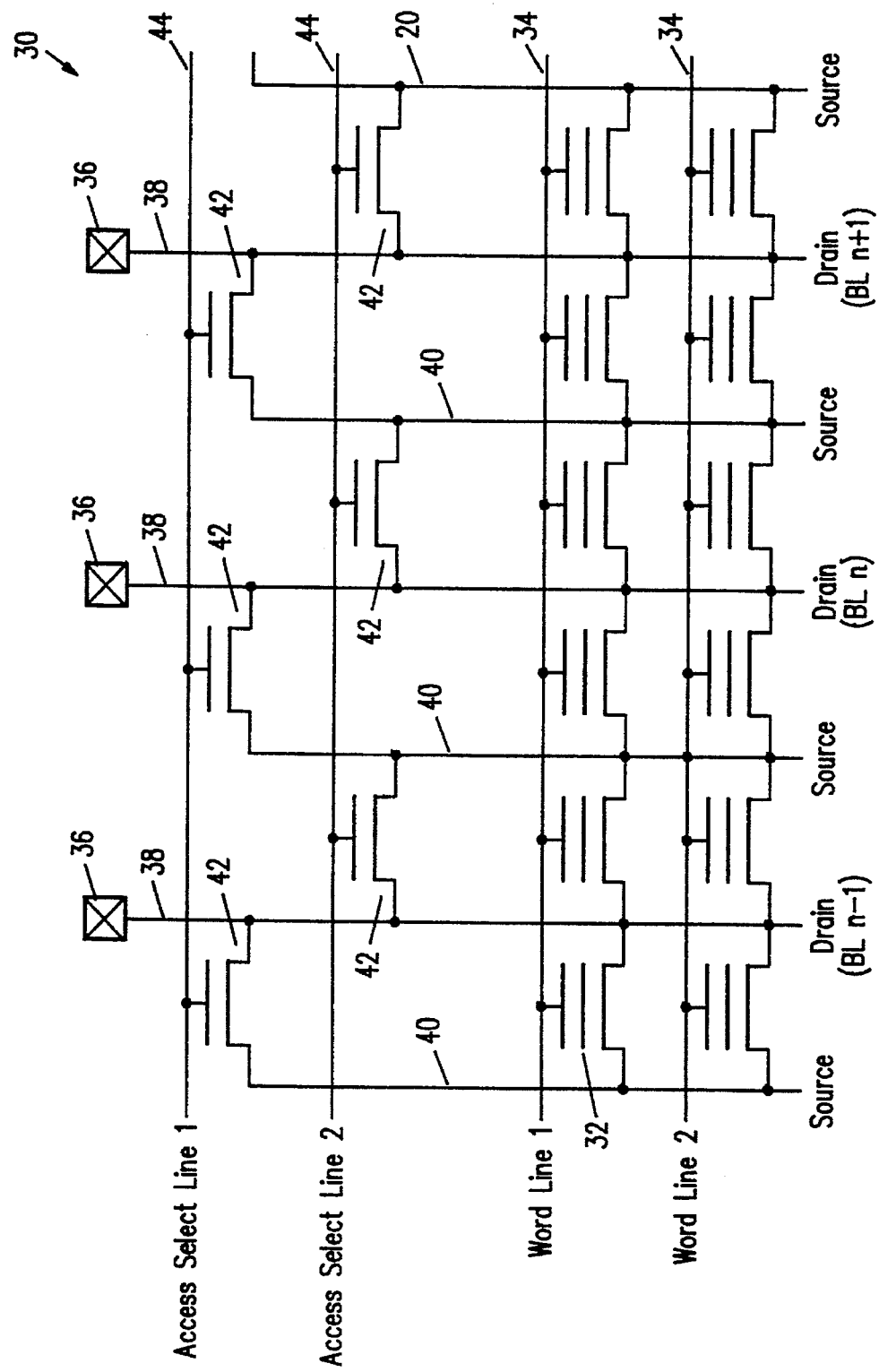
FIG. 6 is a schematic diagram illustrating an equivalent circuit for the FIG. 5 layout.
Figure 7:
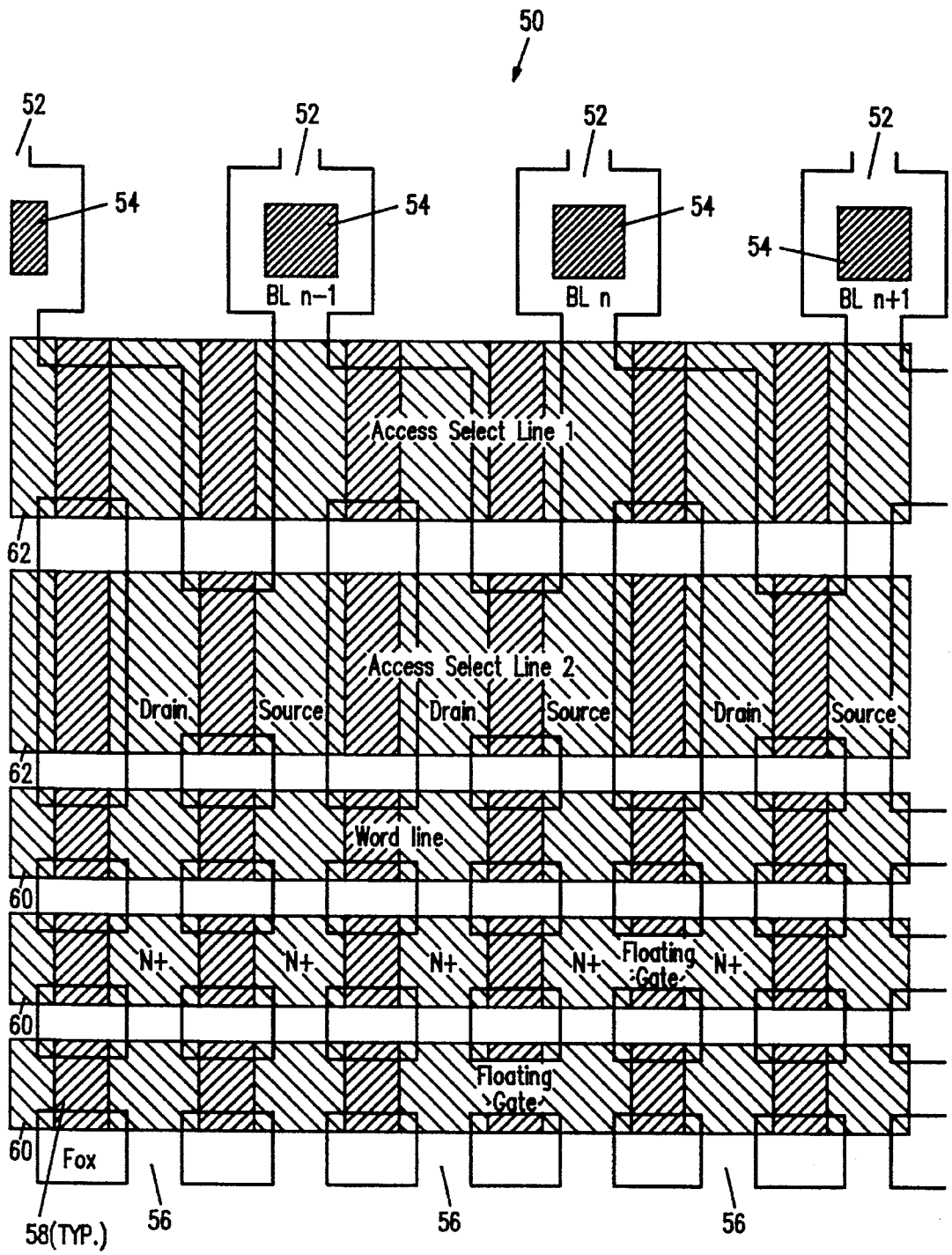
FIG. 7 is a layout drawing illustrating a portion of a cross-point contactless flash EPROM cell array that utilizes source-side erase from the cell's floating gate to a contacted, graded source bit line.
Figure 8:
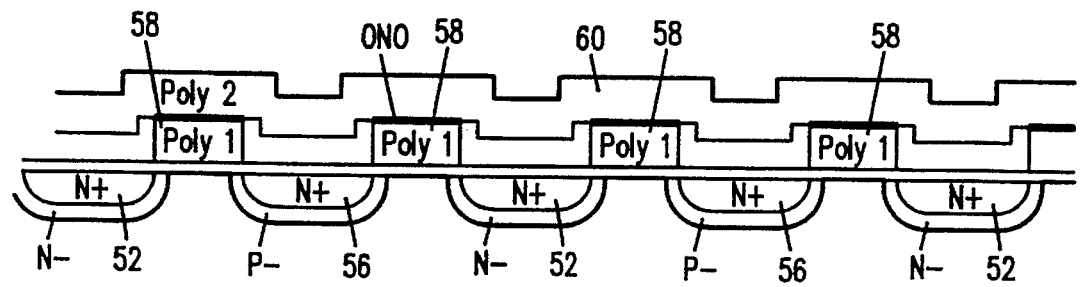
FIG. 8 is a cross-section drawing taken along a word line in the FIG. 7 layout.
Figure 9:
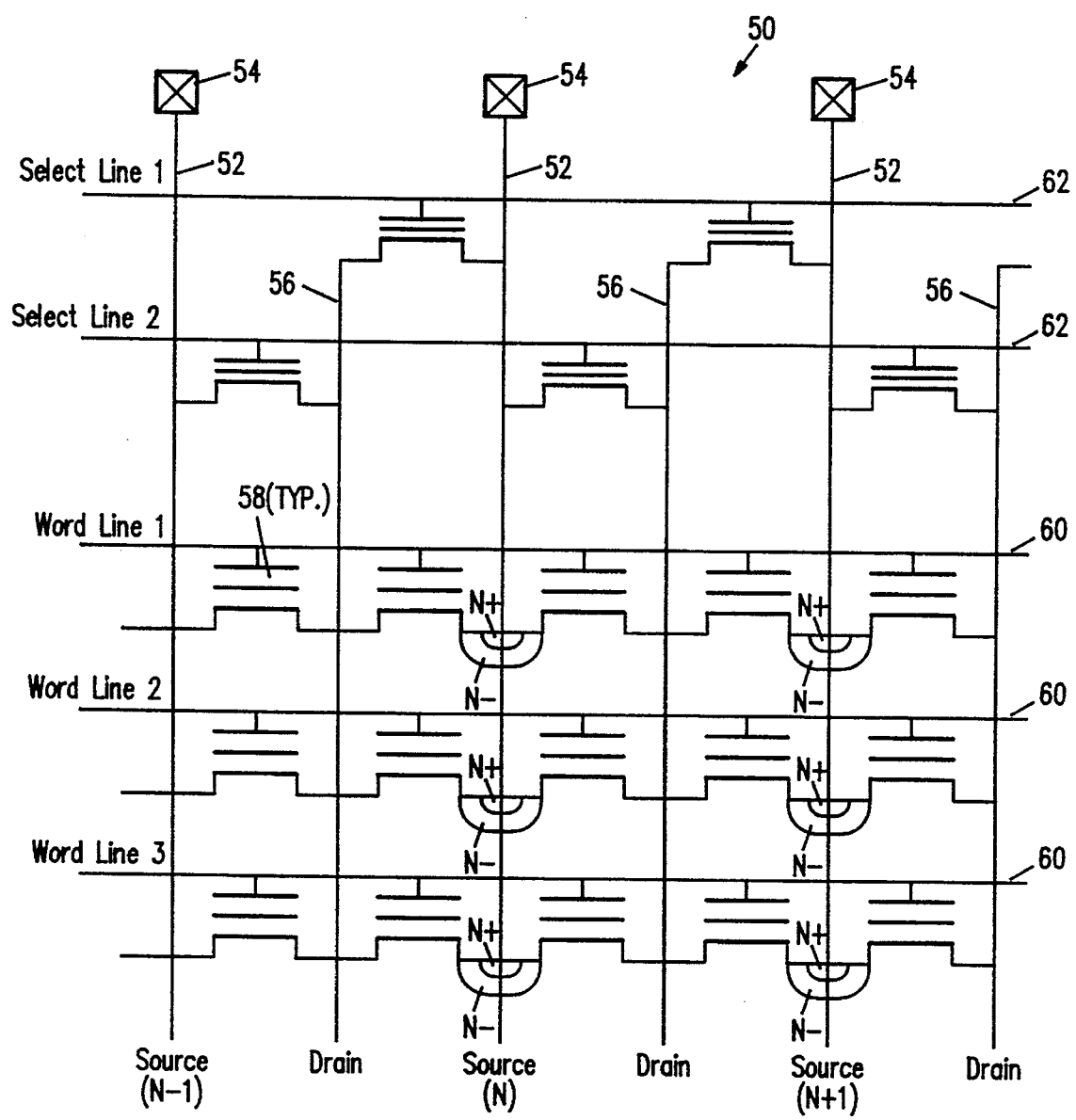
FIG. 9 is a schematic diagram illustrating an equivalent circuit for the FIG. 7 layout.
Figure 10A:
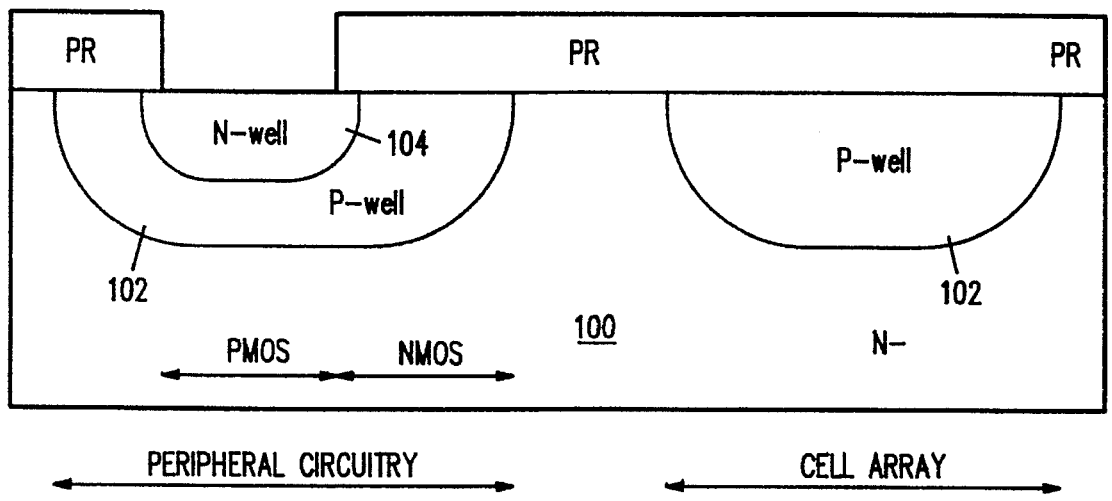
FIG. 10a is a cross-section drawing illustrating a triple-well structure utilizable in fabricating a contactless flash EPROM array in accordance with the present invention.

Referring to FIG. 10a, the fabrication process begins with a silicon substrate 100 of N-type conductivity. In a conventional front-end process step, an initial oxide layer (not shown) is grown over the substrate 100. A layer of photoresist mask is then formed over the initial oxide layer and patterned to define selected surface areas of the N-type substrate 100. The exposed surface areas of the substrate 100 are then implanted with a P-type dopant to form P-well regions 102. The photoresist mask is then stripped from the surface of the oxide and a thermal drive-in step is performed to further define the P-well regions 102. The initial oxide layer is then removed from the substrate 100 and a second oxide layer (not shown) is grown over the substrate 100. The substrate 100 is then again masked covered with photoresist, which is patterned to define substrate surface areas within those P-well regions 102 which will ultimately contain the peripheral P-channel circuitry. N-type dopant is implanted into the exposed substrate surface areas of the peripheral P-wells 102 to define N-well regions 104. The photoresist is then stripped and a further drive-in step for both the N-well regions 104 and the P-well regions 102 is performed. Following the drive-in step, the second oxide layer is removed, resulting in the structure shown in FIG. 10a.

Thus, the initial processing steps result in the formation of a triple-well structure. The N-well regions 104 in the periphery will be utilized for the fabrication of PMOS devices. The P-well regions 102 in the periphery will be utilized for the formation of NMOS devices. The P-well regions 102 in the memory cell array portion of the substrate 10 will be utilized for formation of EPROM storage cell devices and the access transistors. The intermediate substrate region is maintained at the supply voltage (Vcc) to keep the P-well/N junctions reversed biased.

Figure 10B:
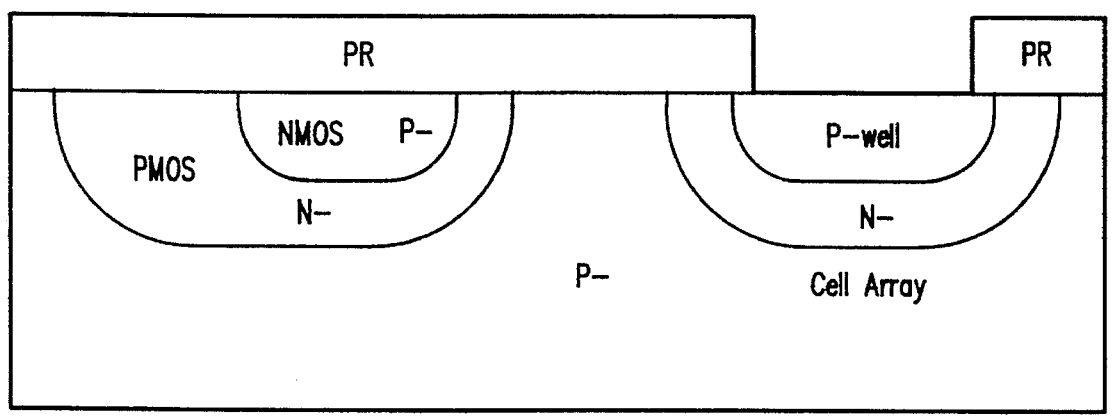
FIG. 10b is a cross-section drawing illustrating an alternative or triple-well structure utilizable in fabricating a contactless flash EPROM array in accordance with the present invention.

FIG. 10b shows in alternate triple well structure that can also be utilized for fabrication of a contactless flash EPROM array in accordance with the invention. In the FIG. 10b embodiment, the P-well is formed in an N-well which, in turn, is formed in a silicon substrate of P-type conductivity.

The important feature of the triple-well structure shown in each of FIG. 10a and FIG. 10b is the provision of a P-well formed in N-type silicon, such that, as described in greater detail below, the P-well can be maintained at the supply voltage to facilitate channel erase of the EPROM array fabricated in the P-well.

Figure 11:
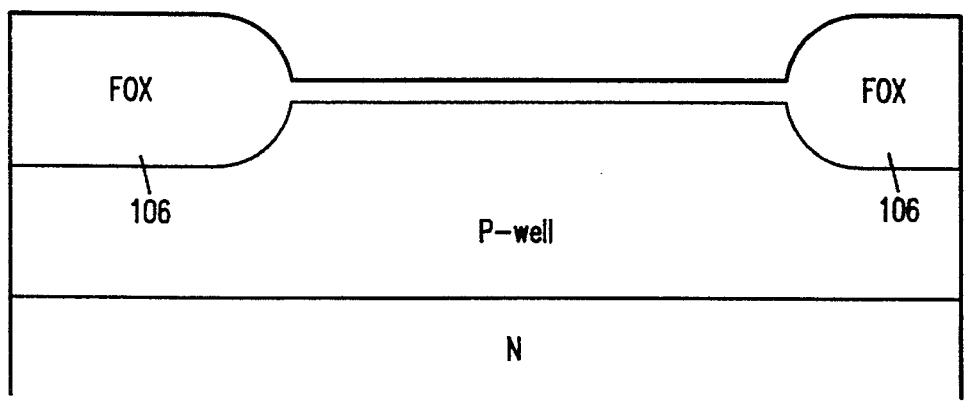
FIG. 11 is a cross-section drawing illustrating formation of field oxide structure in the P-well memory cell array portion of the triple-well structure shown in FIG. 10a or FIG. 10b.

After formation of the triple-well structure described above, conventional process techniques are utilized to define regions in the substrate 100 for formation of field oxide. That is, a pad oxide is first grown on the surface of the substrate 100, followed by deposition of an overlying nitride layer. The pad oxide/nitride composite is masked with photoresist, which is then patterned to expose regions of underlying nitride; these regions will ultimately define field oxide (FOX) regions. The nitride is then etched and, the photoresist is stripped. Then, a P-type field mask implant is performed to define P-well field regions. A boron field ion implant is then performed through exposed regions. The field implant mask is then stripped and field oxide regions (FOX) 106 are formed, as shown in FIG. 11.

FIGS. 12–15 illustrate the subsequent sequential steps in the process flow. Each of FIGS. 12–15 includes a plan view of the structure at that stage of the process flow and the following three cross-sectional views in the corresponding structure: (1) in the word line direction in the EPROM cell array (designated "A/A"), (2) in the word line direction in the access transistor area (designated "B/B"), and (3) in the poly1 direction perpendicular to the word line in both the cell array and the access transistor area (designated "C/C").

Figure 12:
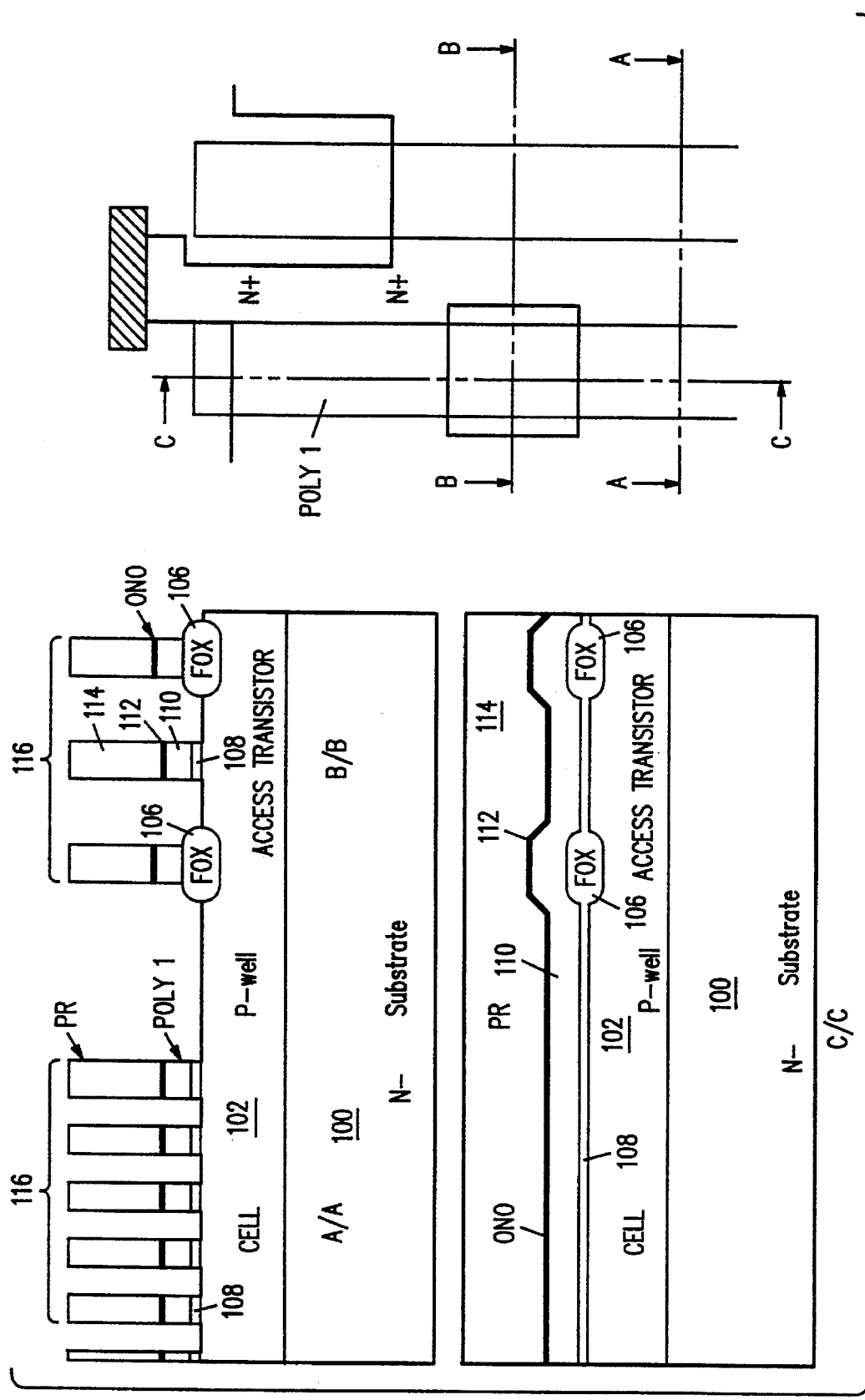
FIGS. 12–15 illustrate a process flow for fabricating an contactless flash EPROM array in accordance with the present invention.

Referring to FIG. 12, after the formation of the field oxide regions 106, the process flow continues with conventional steps common to this type of process and then, with the formation of a 100Å floating gate tunnel oxide 108 on the surface substrate 100. A layer of polysilicon (poly1) 110 is then deposited to a thickness of about 1500Å and doped with phosphorus at a dose of $2-5 \times 10^{15}$ at low implant energy.

Next, as further shown in FIG. 12, a composite dielectric layer of oxide/nitride/oxide 112, commonly called "ONO", is formed on the poly1 110. After growing the ONO layer 112, a photoresist mask 114 is used to define spaced-apart parallel stripes on the ONO 112. The ONO 112 and underlying poly1 110 are then plasma etched to form spaced-apart parallel stacks 116 of ONO/poly1.

Figure 13:
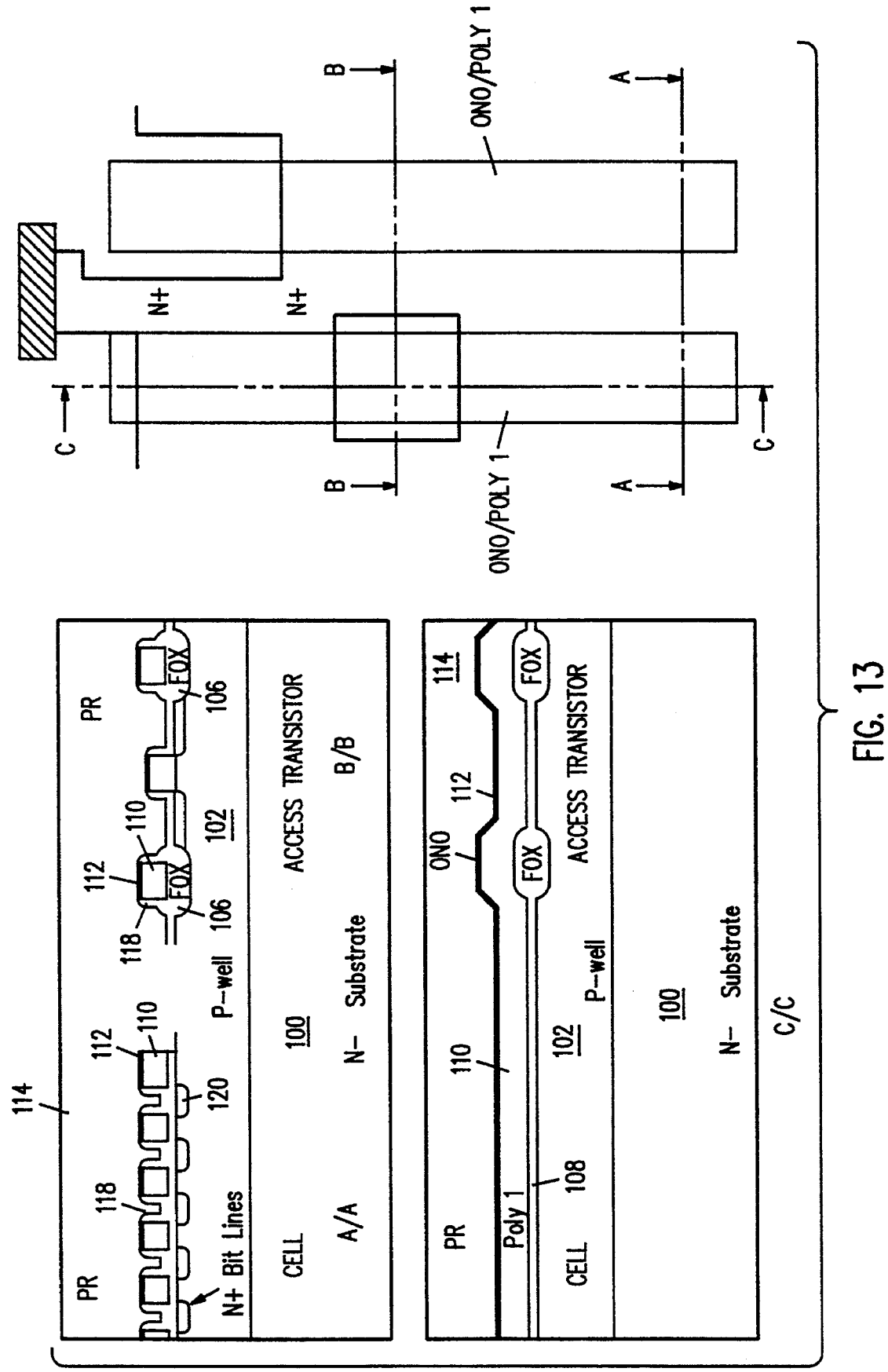

Referring to FIG. 13, an arsenic implant, self-aligned to poly1, is then performed to define $N^+$ bit lines 120. The photoresist is then stripped and a "differential" oxide is grown over the $N^+$ bit line areas to provide substantial latitude in subsequent ONO and/or poly plasma etch steps. If, for example, a poly plasma etch is performed without formation of the differential oxide, then the poly plasma etch step could lead to the "trenching" of silicon in the exposed $N^+$ bit lines areas. For this reason, this step contributes to the equivalent oxide loss during ONO etch and is, hence, called differential oxidation.

Following the differential oxidation step, a mask step called "protect array" is performed. This mask is used to etch the ONO/poly1 layer (the poly1 mask is a dark field mask) leaving ONO/poly1 out of the array. This avoids the use of an extra mask to protect the periphery during the subsequent $N^+$ bit line arsenic implant. The arsenic implant is then performed on the full wafer with no mask.

Next, the ONO/poly1 layers are plasma etched and the underlying floating gate oxide is removed in a wet chemistry etch utilizing diluted HF. Then, the photoresist is stripped.

Figure 14:
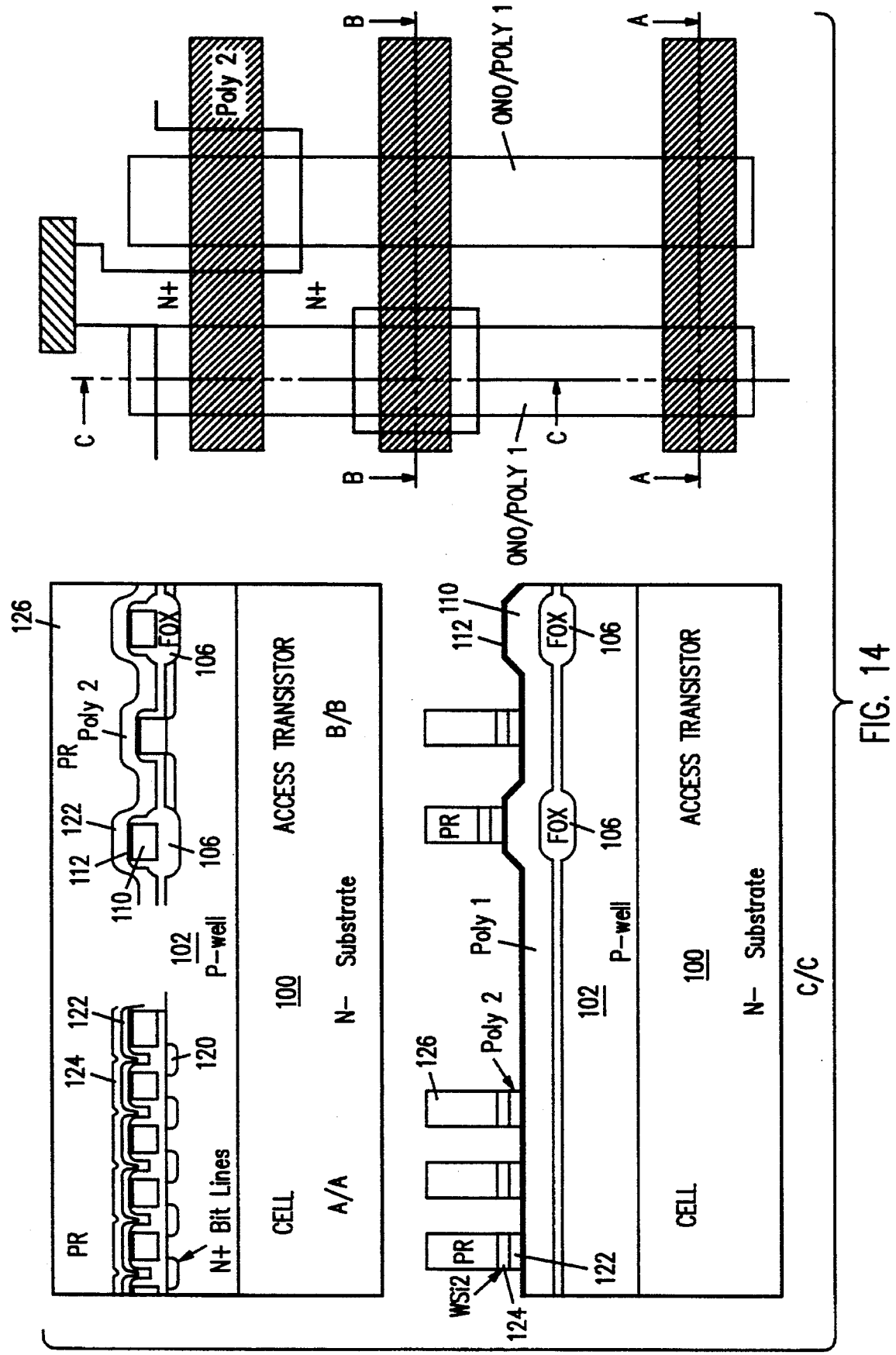

Referring now to FIG. 14, the next step in the process involves the growth of 200Å gate oxide everywhere in the gate channel regions out of the array. A threshold voltage mask ($V_{tp}$ mask) is then performed and P-channel regions are boron implanted to provide the right threshold voltage. After $V_{tp}$ mask photoresist strip, a second layer 122 of 2000Å polysilicon (poly2) is deposited and doped with phosphorous. Then, a 2500Å tungsten silicide layer 124 is deposited and a poly2 mask is performed. The poly2 mask 126 has three functions: defining the gates of the transistors in the periphery, defining the gates of the access transistors in the array, and defining the word lines of the EPROM cells. Next, the tungsten silicide layer 122 and the poly2 layer 124 are plasma etched. It is noted that the access transistors are flash EPROM cells with larger width than the array flash EPROM cells to drive larger current than the array cells.

Figure 15:
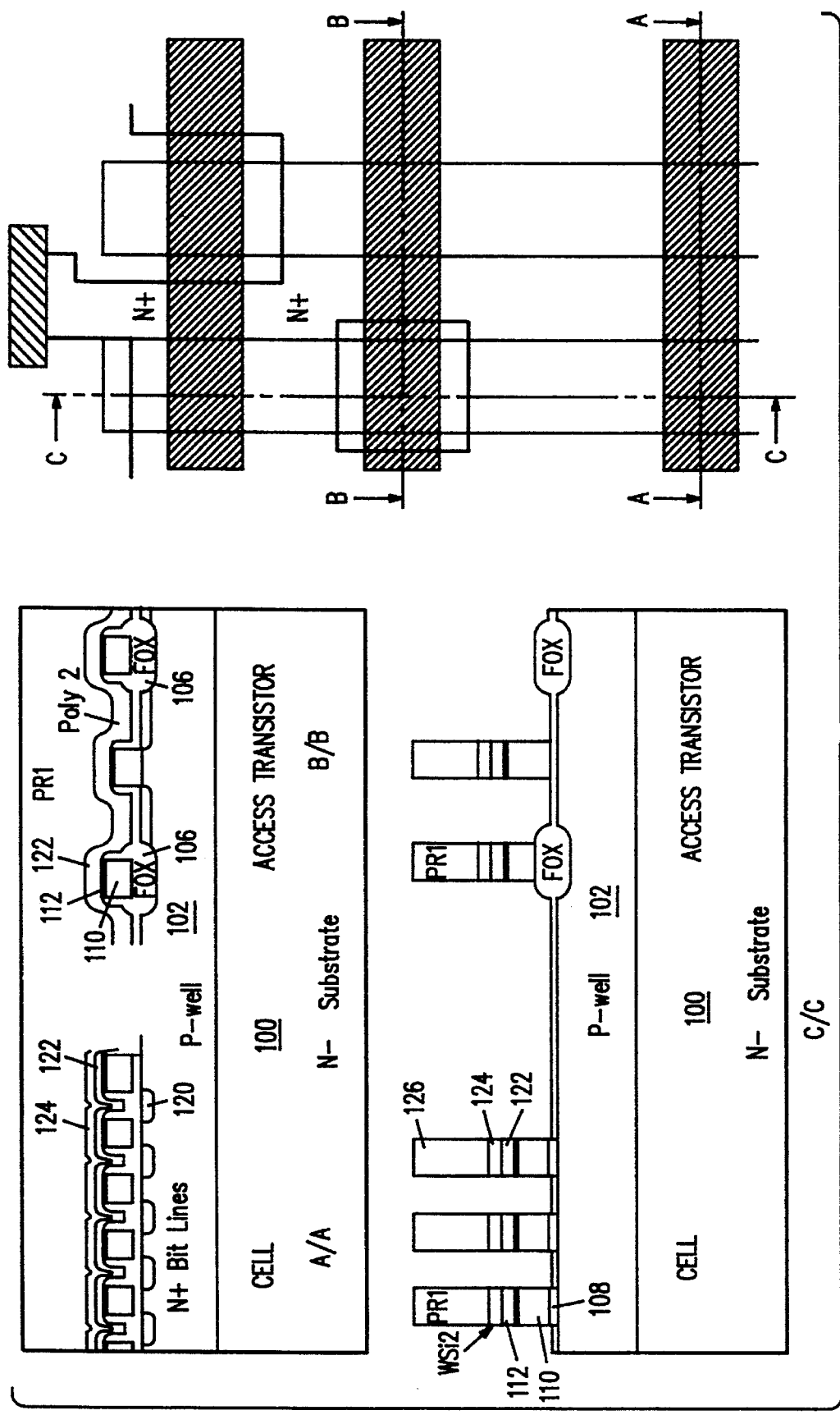

Referring to FIG. 15, after this plasma etch, the photoresist is not stripped. A second photoresist is spun on and a new masking step is performed. This new mask, called self-aligned etch, maintains the integrity of the photoresist of the preceding poly2 mask in order to allow self-aligned etch to poly2 of the residual ONO/poly 1 layer between the lines in the flash EPROM cell array. This etch ends the construction of the flash EPROM cell.

Figure 16:
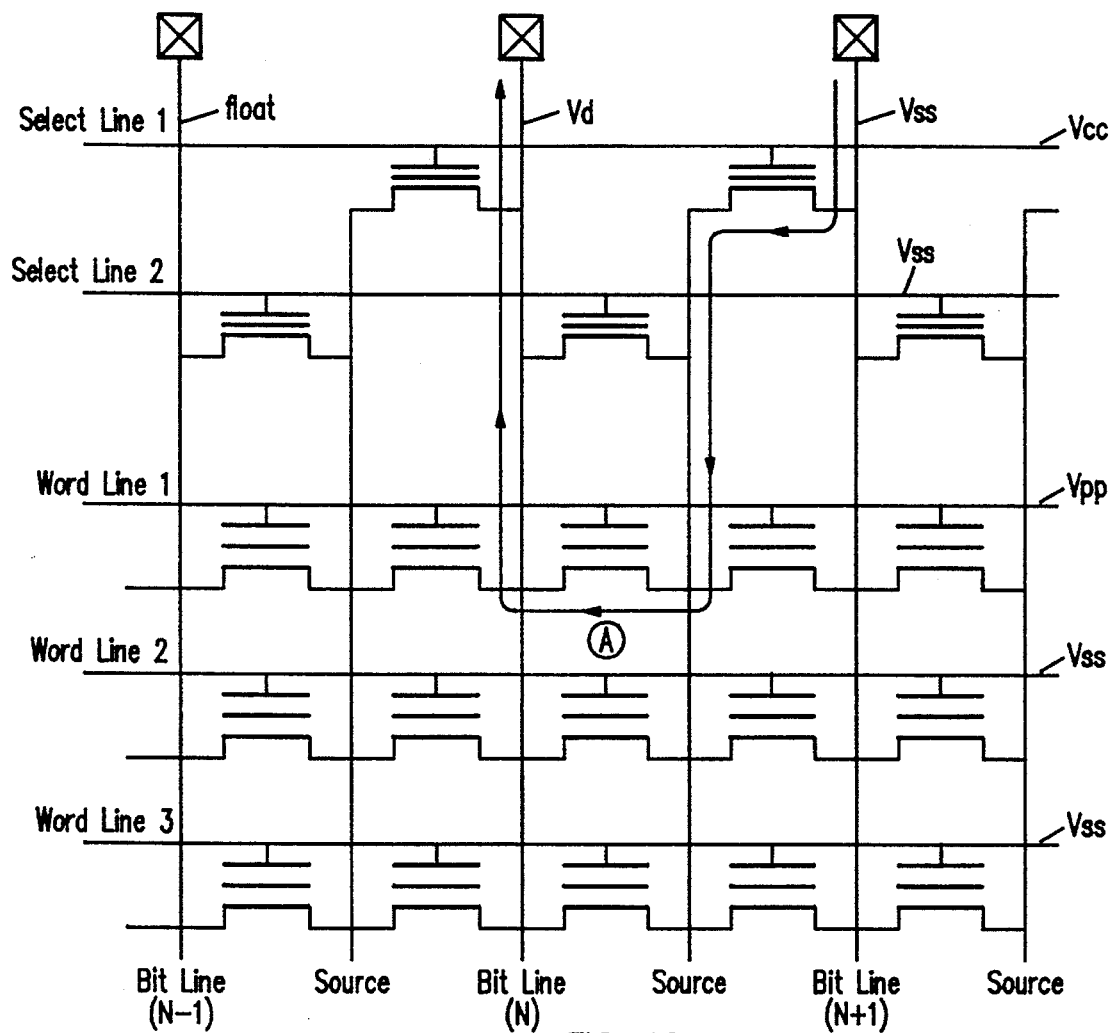
FIG. 16 is a schematic diagram illustrating the bias conditions for programming a selected cell in an a contactless flash EPROM array in accordance with the present invention.

As shown in FIG. 16, the above-described array is programmed in the conventional AMG manner. That is, to program cell A, the source bit line N of cell A held at an intermediate voltage Vd (approx 5–7 V), source bit line N+1 is held at ground, and source bit line N−1 is allowed to float. Select line 1 is biased to the supply voltage Vcc (approx. 5 V) and select line 2 is held at ground. The word line WC1 associated with cell A is taken to the programming voltage Vpp (approx. 12–13VO, while the remaining word lines (WC2/WL3) are grounded. These bias conditions result in current flow as shown by the arrow in FIG. 16, which results in electron injection from the drain of cell A to the floating gate of cell A, thus programming cell A.

Figure 17:
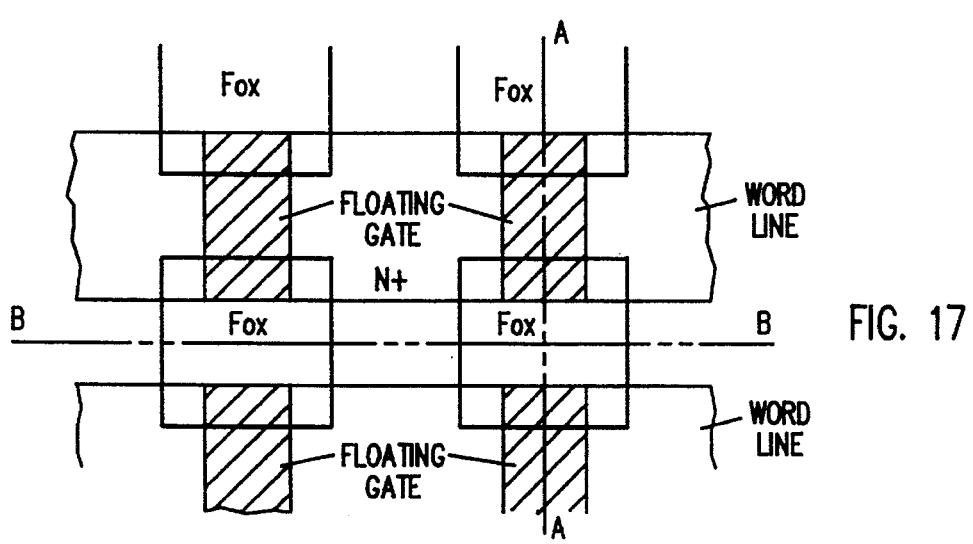
FIG. 17 is a layout drawing illustrating two EPROM cells in a contactless flash EPROM array in accordance with the present invention.
Figure 18:
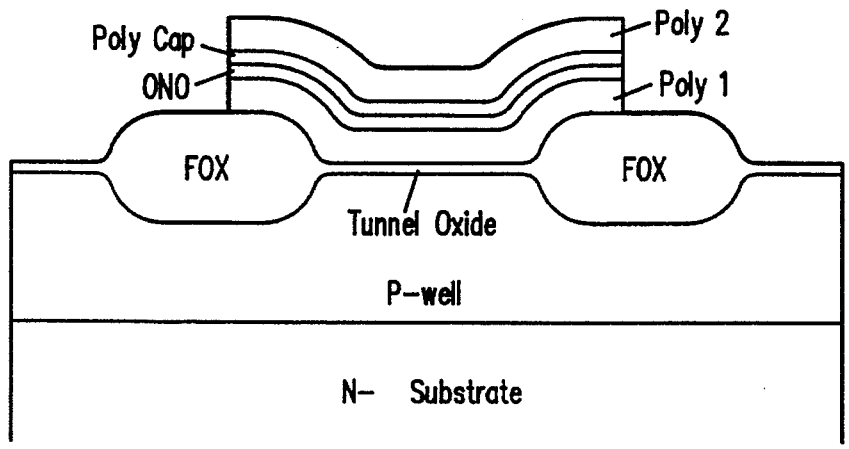
FIG. 18 is a cross-section drawing of a FIG. 16 flash EPROM cell taken along line A—A in FIG. 16.
Figure 19:
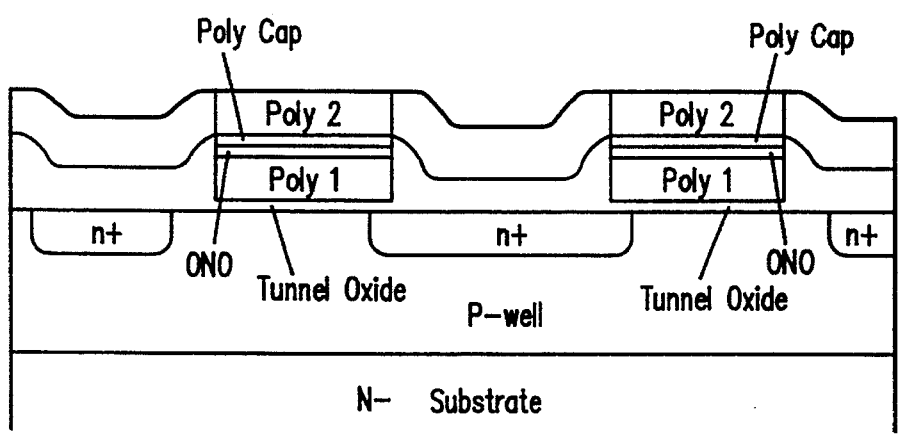
FIG. 19 is a cross-section drawing of a FIG. 16 flash EPROM cell taken along line B—B in FIG. 16.

As stated above, in the above-described flash array, erase is achieved using a "channel erase". As shown in FIGS. 17–19, this requires the formation of thin tunnel oxide about 100–120Å thick beneath the floating gates of the EPROM cells. To compensate for low coupling ratio induced by the thinner tunnel oxide under the floating gate, the floating gate includes poly1 "extensions" over the field oxide (FOX) in the array.

Figure 21:
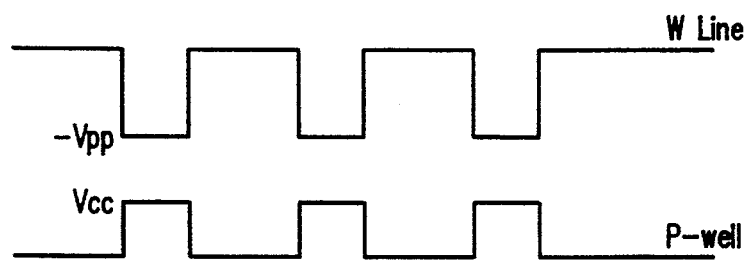
FIG. 21 is a timing diagram illustrating the waveforms of the selected word line voltage and of the P-well voltage for erasing the cells on the selected word line in a flash EPROM array in accordance with the present invention.
Figure 22:
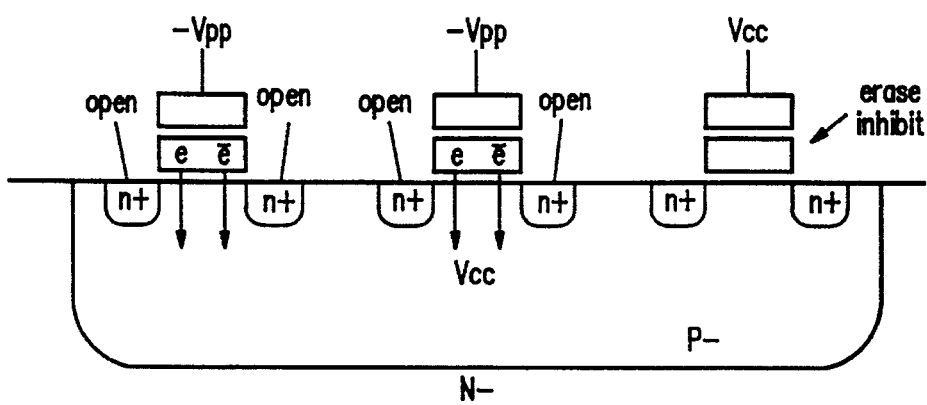
FIG. 22 is a cross-section drawing illustrating the erase mechanism in a flash EPROM array in accordance with the present invention.
Figure 20:
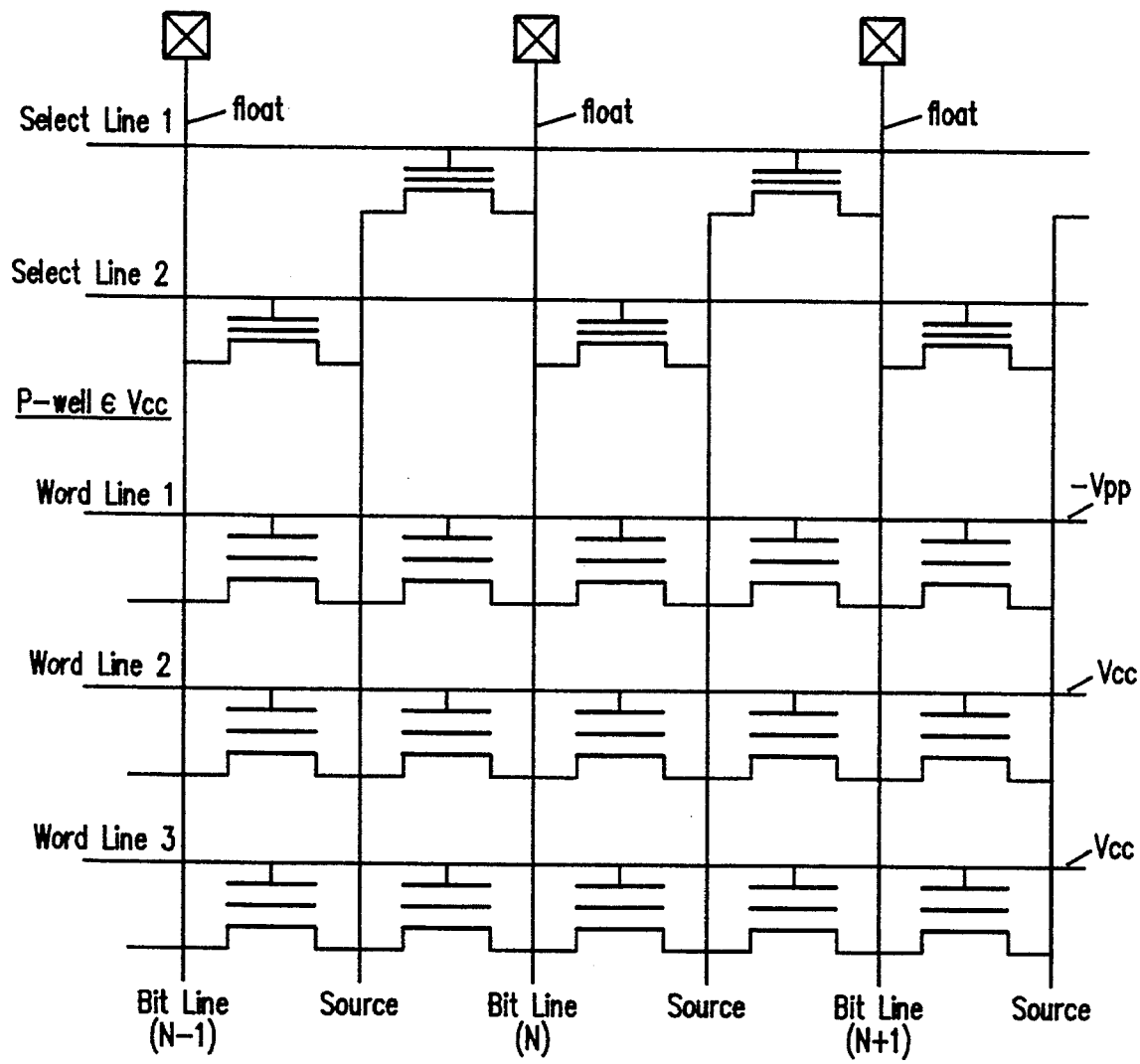
FIG. 20 is a schematic diagram illustrating the bias conditions for erasing the cells on a selected word line in a contactless flash EPROM array in accordance with the present invention.

As shown in FIGS. 20–22, in the "channel erase" operation, a high negative voltage −Vpp (approx. −12V to −13 V) is applied to the word line of each row in the array selected for erasure. A positive voltage Vcc (approx. 5 V) is applied to the channel area, i.e. to the p-well. The source and drain bit lines are kept open, i.e. floating. The remaining rows are "erase inhibited" by applying the supply voltage Vcc to their associated word lines. These bias conditions cause Fowler-Nordheim current to flow from the floating gates of the cells in the selected rows to the p-well. The erase operation requires low current, thus allowing the use of a high voltage negative charge pump. Furthermore, the band-to-band tunneling and the large erase currents inherent to the conventional source erase operation are eliminated, suggesting a larger cycling endurance for the channel erase device.

As stated above, in a preferred embodiment, the select transistors are flash cells with a W≧2 times the W of a cell in the array in order to pull down Vss on the intermediate node.

It should be understood that various alternatives to the embodiment of the invention described herein may be employed in practicing the invention. It is intended that the following claims define the scope of the invention and that methods and structures within the scope of these claims and their equivalents be covered thereby.

What is claimed is:

1. A method of erasing selected rows in a contactless flash EPROM array formed in a P-type well that is formed in an N-type silicon substrate, and wherein the flash EPROM array includes a layer of tunnel oxide about 100–120Å thick formed on a surface of the P-type well, a plurality of rows and columns of polysilicon floating gates formed on the tunnel oxide layer, each polysilicon floating gate having a layer of dielectric material formed thereon, an N-type bit line formed in the P-type well between each two adjacent columns of polysilicon floating gates to define a plurality of spaced-apart N-type bit lines in the P-type well, alternating of said bit lines being contacted to define drain bit lines of said array, bit lines between adjacent drain bit lines being non-contacted to define source bit lines of said array such that each source bit line has first and second adjacent drain bit lines associated therewith, each source bit line being electrically connectable to the associated first adjacent drain bit line via a first MOS select transistor having its gate connected to a polysilicon first select line and to the associated second adjacent drain bit line via a second MOS select transistor having its gate connected to a polysilicon second select line, the array further including a plurality of spaced-apart parallel polysilicon word lines formed perpendicular to the columns of floating gates, each word line overlying the floating gates in a row of said array such that the floating gates in said row are separated from said word line by the dielectric material formed on each said floating gate in said row of said array, the erase method comprising:

while maintaining the P-type well at a positive supply voltage, applying a negative erase voltage to the polysilicon word line of each row of said array selected for erasure;

maintaining the source bit lines and the drain bit lines of said array floating; and applying the supply voltage to the polysilicon word line of each row of said array not selected for erasure.

2. A method as in claim 1 and wherein the supply voltage is approximately 5 V and the erase voltage is approximately −12 V to −13 V.

* * * * *